(12) United States Patent
Togawa

(10) Patent No.: US 7,448,940 B2
(45) Date of Patent: Nov. 11, 2008

(54) POLISHING APPARATUS AND POLISHING METHOD

(75) Inventor: Tetsuji Togawa, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/785,533

(22) Filed: Apr. 18, 2007

(65) Prior Publication Data

US 2007/0190913 A1    Aug. 16, 2007

Related U.S. Application Data

(62) Division of application No. 10/477,533, filed as application No. PCT/JP02/05196 on May 29, 2002, now Pat. No. 7,217,175.

(30) Foreign Application Priority Data

May 29, 2001    (JP) .............................. 2001-161393

(51) Int. Cl.
*B24B 49/00* (2006.01)
*B24B 51/00* (2006.01)
*B24B 1/00* (2006.01)

(52) U.S. Cl. .................. 451/5; 451/8; 451/41
(58) Field of Classification Search ............... 451/5, 451/8, 11, 41, 285–290
See application file for complete search history.

(56) References Cited

U.S. PATENT DOCUMENTS

| | | | |
|---|---|---|---|
| 5,720,845 A * | 2/1998 | Liu | 438/692 |
| 5,762,539 A | 6/1998 | Nakashiba et al. | |
| 5,795,215 A | 8/1998 | Guthrie et al. | |
| 5,803,799 A | 9/1998 | Volodarsky et al. | |
| 5,916,016 A | 6/1999 | Bothra | |
| 5,916,412 A * | 6/1999 | Nakashiba et al. | 451/41 |
| 6,068,549 A | 5/2000 | Jackson | |
| 6,220,930 B1 | 4/2001 | Lin et al. | |
| 6,231,428 B1 | 5/2001 | Maloney et al. | |

(Continued)

FOREIGN PATENT DOCUMENTS

EP        1 034 887        9/2000

(Continued)

OTHER PUBLICATIONS

European Search Report issued Jun. 20, 2008 in European Application No. 02730744.6 which is a foreign counterpart of the present application.

*Primary Examiner*—Maurina Rachuba
(74) *Attorney, Agent, or Firm*—Wenderoth, Lind & Ponack, L.L.P.

(57) ABSTRACT

A polishing apparatus comprises a first polishing table having a first polishing surface, a substrate carrier for holding a substrate and positioning the substrate so as to bring a surface of the substrate into contact with the first polishing surface, a pressing mechanism for pressing, against the first polishing surface, the surface of the substrate which has been brought into contact with the first polishing surface by the substrate carrier, a retainer ring mounted on the substrate carrier so as to surround the substrate which has been pressed against the first polishing surface by the pressing mechanism, and a retainer-ring-position-adjustment mechanism for adjustably positioning the retainer ring relative to the substrate, which has been pressed against the first polishing surface, in directions toward and away from the first polishing surface.

7 Claims, 7 Drawing Sheets

U.S. PATENT DOCUMENTS

| | | | |
|---|---|---|---|
| 6,241,585 B1 | 6/2001 | White | |
| 6,273,794 B1 * | 8/2001 | Tietz et al. | 451/41 |
| 6,350,346 B1 * | 2/2002 | Nakashiba et al. | 156/345.14 |
| 6,354,928 B1 | 3/2002 | Crevasse et al. | |
| 6,361,420 B1 * | 3/2002 | Zuniga et al. | 451/288 |
| 6,705,930 B2 | 3/2004 | Boyd et al. | |
| 6,890,249 B1 * | 5/2005 | Zuniga et al. | 451/398 |

FOREIGN PATENT DOCUMENTS

| | | |
|---|---|---|
| EP | 1 092 505 | 4/2001 |
| EP | 1 177 859 | 2/2002 |
| GB | 2 338 439 | 12/1999 |
| JP | 9-225821 | 9/1997 |
| JP | 2001-44150 | 2/2001 |
| JP | 2001-51351 | 2/2001 |
| WO | 99/07516 | 2/1999 |

* cited by examiner

POLISHING APPARATUS AND POLISHING METHOD

This is a divisional application of Ser. No. 10/477,533, filed May 3, 2004, now U.S. Pat. No. 7,217,175 which is the National Stage of International Application No. PCT/JP02/05196, filed May 29, 2002.

BACKGROUND OF THE INVENTION

1. Field of the Invention

The present invention relates to an apparatus for performing planarization polishing of a substrate, and in particular to an apparatus for performing chemical-mechanical polishing of a substrate such as a semiconductor wafer, for planarizing the substrate.

2. Background Art

In earlier polishing apparatus, a substrate to be polished was held on the lower surface of a substrate carrier. Then, to polish the substrate, it was pressed against a polishing pad as a polishing slurry was supplied to the polishing surface of the pad, while establishing a relative motion between the substrate and the polishing pad. The substrate carrier was provided with a retainer ring to prevent the substrate from being dislodged from the lower surface of the substrate carrier during polishing. The substrate was surrounded by the retaining ring to hold it in place on the carrier During polishing performed on the resilient polishing pad, however, excessive polishing occurred at the periphery of the workpiece, producing an effect referred to as 'edge rounding.' To suppress this edge rounding effect, the retainer ring was pressed against the polishing pad to flex it slightly downward at its periphery.

In conventional polishing apparatus such as described above, although pressing the retainer ring against the polishing pad solved the edge rounding problem, thus improving the surface finish precision of the polished workpiece, it also resulted in poor distribution of slurry over the surface of the workpiece being polished, which reduced polishing speed, thereby degrading productivity. This tendency was especially pronounced when the surface being polished was a metal film. Consequently, this conventional polishing apparatus was poorly suited for high-speed polishing, which requires that a large amount of slurry be supplied to the surface being polished.

Recently, polishing apparatuses that use a fixed abrasive instead of a polishing pad have been developed. Because a fixed abrasive experiences almost no shape deformation when a workpiece is pressed against it, it produces very little edge rounding, even in the absence of downward pressure from a retainer ring. When such a fixed abrasive is used for polishing in a conventional polishing apparatus, however, because the retainer ring is now being pressed against a fixed abrasive, the ring wears faster, and the shorter retainer ring service life causes a corresponding increase in cost.

BRIEF SUMMARY OF THE INVENTION

It is therefore an object of the present invention to provide a polishing apparatus and method capable of performing polishing such that edge rounding is eliminated, thus improving the finish precision of the polished workpiece; and such that a large amount of polishing solution can be supplied to the surface being polished, thereby increasing polishing speed and improving productivity.

To accomplish the above object, according to a first aspect of the present invention, a polishing apparatus 1, as shown for example in FIGS. 1 and 2, comprises a substrate carrier 10 having a retainer ring 3 that surrounds a substrate S for retaining the substrate S; a polishing tool 15, for polishing the substrate S; a substrate-pressing mechanism 11, for bringing a substrate S into contact with a polishing surface 17 of the polishing tool 15; a retainer-ring-pressing mechanism 16 for bringing the retainer ring 3 into contact with the polishing surface 17; and a retainer-ring-position-adjustment mechanism 4, for adjusting the positional relationship between the retainer ring 3 and the polishing surface 17 such that a gap is formed therebetween when the substrate S is brought into contact with the polishing surface 17.

This configuration has a retainer-ring-pressing mechanism 16 for pressing the retainer ring 3 against the polishing surface 17. This prevents the forming of an 'edge rounding' on the polished substrate surface SA when it is polished by the polishing surface 17, thereby improving the surface finish precision of the polished substrate S. The configuration also includes a retainer-ring-position-adjustment mechanism 4. When necessary, this retainer-ring-position-adjustment mechanism 4 can used to adjust the positional relationship between the retainer ring 3 and the polishing surface 17 such that when the substrate S is pressed against the polishing surface 17, a gap will be formed between the retainer ring 3 and the polishing surface 17. When this is done, the lack of physical contact between the retainer ring 3 and the polishing surface 17 increases the polishing speed (polishing rate), thus improving polishing productivity.

Also, according to a second aspect of the present invention, the polishing apparatus 1 of the first aspect thereof adds two sensors (18 and 19) for sensing the amount of polishing of the substrate S by the polishing tool 15. This enables the apparatus to switch back and forth between a mode in which polishing is performed with the retainer ring 3 being pressed against the polishing surface 17 by the retainer-ring-pressing mechanism 16, and a mode in which polishing is performed with no contact between the retainer ring 3 and the polishing surface 17, thus to perform appropriate polishing based on the amount of polishing already performed, as sensed by the sensors (18 and 19).

Also, a polishing method for accomplishing the above object according to a third aspect of the present invention, as shown for example in FIGS. 1 and 2, comprises a first step of holding the substrate S in the substrate carrier 10 surrounded by the retainer ring 3; a second step of bringing the substrate S into contact with the polishing surface 17 while adjusting the positional relationship between the retainer ring 3 and the polishing surface 17 such that a gap is formed therebetween, and also effecting relative motion between the substrate S and the polishing surface 17, for performing polishing; and a third step of bringing the substrate S into contact with the polishing surface 17 while pressing the retainer ring 3 into contact with the polishing surface 17, and also effecting relative motion between the substrate S and the polishing surface 17, for performing polishing.

Also, a polishing method according to a fourth aspect of the present invention is the method of the above third aspect wherein the polishing surface 17 of the second step is a fixed abrasive 15B; and the polishing surface 17 of the third step is a polishing pad 15A.

Moreover, a polishing method according to a fifth aspect of the present invention is the method of the third or fourth aspect wherein at least one of the second and third steps includes a fourth step of measuring the amount of polishing, and wherein the process proceeds from the fourth step to the other of the second and third steps after the amount of polishing reaches a prescribed value.

BRIEF DESCRIPTION OF THE SEVERAL VIEWS OF THE DRAWINGS

These and other features, aspects, and advantages of the present invention will become apparent with reference to the following description, claims, and accompanying drawings, where:

DETAILED DESCRIPTION

The best mode for implementing the present invention is described below, with reference to the drawings. For the purposes of this description, when the same item or an equivalent item appears in more than one figure, it is assigned the same number in all drawings in which it appears, and the description of that item is not repeated.

Figure 1:
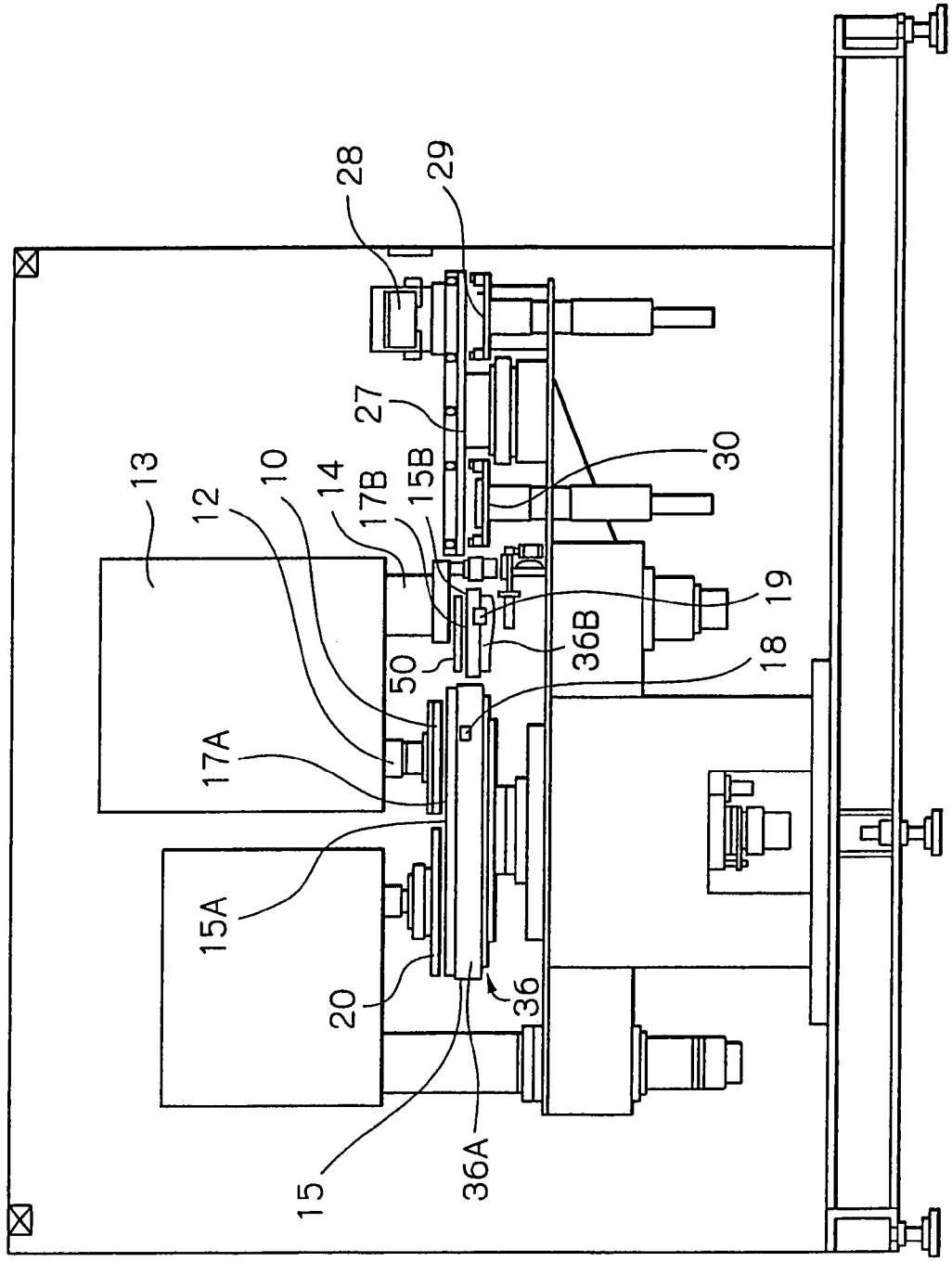
FIG. 1 shows an external view of the polishing apparatus in one embodiment of the present invention.

FIG. 1 shows an exterior view of a polishing apparatus 1 in this embodiment of the present invention. The configuration of this polishing apparatus will now be described, with reference to FIG. 1.

The polishing apparatus 1 comprises a substrate carrier 10 for holding a substrate S, a carrier drive shaft 12 for driving the substrate carrier 10 in rotation, a carrier head 13 that supports the carrier drive shaft 12 and a pivotal shaft 14. The pivotal shaft 14 pivots with its own axis as the center of motion, thereby causing a similar pivoting of the carrier head 13 and substrate carrier 10.

The polishing apparatus 1 also comprises a polishing table 36, which has a polishing tool 15 attached to it; and a rotary transporter 27 for transporting items between a lifter 29 and a pusher 30 (both to be described later). The polishing tool 15 has a polishing pad 15A and a fixed abrasive 15B. The polishing table 36 has a turntable 36A, to which the polishing pad 15A is attached; and a scroll table 36B, to which the fixed abrasive 15B is attached. The polishing surface 17 of the polishing tool 15 is constituted of a polishing surface 17A of the polishing pad 15A, and a polishing surface 17B of the fixed abrasive 15B.

During polishing, purified water, a slurry, or a chemical solution (or a combination of these) can be supplied to the turntable 36A and scroll table 36B as a polishing solution. The substrate carrier 10 can be positioned directly above the turntable 36A, the scroll table 36B, or a pusher 30 (to be described later), by pivoting the pivotal shaft 14. The pivotal shaft 14 has a positioning mechanism (not shown in the drawing) through which the substrate carrier 10 can be pivotally positioned.

The polishing apparatus 1 also comprises a substrate inverter 28 for turning over a substrate S; a lifter 29 for transporting the substrate S between the substrate inverter 28 and the rotary transporter 27; a pusher 30 for accepting a substrate S transported by the rotary transporter 27 and transferring it to the substrate carrier 10; a first dresser 20 for dressing the polishing pad 15A of the turntable 36A, and a second dresser 50 for dressing the fixed abrasive 15B of the scroll table 36B.

The substrate carrier 10 will be described with reference to FIG. 2. The substrate carrier 10 has a cylindrical-container-like substrate carrier main unit 2 that has an internal containment space; and a retainer ring 3 that is installed on the bottom of the substrate carrier main unit 2 so as to form a single unit therewith. Enclosed within a space defined by the inside of the substrate carrier main unit 2 and the retainer ring 3, are a seal ring 42 that touches the top of a substrate S, a ring-shaped holder ring 5, and an approximately circular-disk-shaped chucking plate 6 for holding the seal ring 42. The lower surface of the substrate S is the to-be-polished substrate surface SA.

The seal ring 42, which is made of a resilient film, has its outer periphery clamped between the holder ring 5 and the chucking plate 6 (which is fastened to the bottom of the holder ring 5) such that it covers the outer edge of the top surface, outer side portion, and outer edge of the bottom surface, of the chucking plate 6. This results in a space G being formed between the seal ring 42 and the chucking plate 6. During polishing, the seal ring 42 adheres tightly to the top surface of the substrate S, sealing the space G.

A pressure sheet 7 made of a resilient film is stretched between the holder ring 5 and the substrate carrier main unit 2. This pressure sheet 7 is secured by having its outer peripheral edge portion clamped between a housing 2A of the substrate carrier main unit 2 and a pressure sheet support 2B, and its inner peripheral edge portion clamped between the top 5A and stopper 5B of the holder ring 5. The substrate carrier main unit 2, chucking plate 6, holder ring 5, and pressure sheet 7 combine to form a pressure chamber 21 inside the substrate carrier main unit 2.

A fluid path 31, made up of tubing, connectors, etc., communicates with the pressure chamber 21, which is connected to a compressed air supply (not illustrated) through a regulator R1 located in the fluid path 31. Provided within a space formed between the substrate S and the chucking plate 6 are a center bag 8 and a ring tube 9 that make contact with the substrate S. The center bag 8, which has a circular contact surface, is placed in the center of the bottom surface of the chucking plate 6; and the ring tube 9, which has a ring-shaped contact surface, is placed outward of the center bag 8, surrounding its periphery.

The space formed between the chucking plate 6 and the substrate S is partitioned into multiple spaces by the center bag 8 and ring tube 9: That is, a pressure chamber 22 is formed between the center bag 8 and ring tube 9, and a pressure chamber 23 is formed outward of the ring tube 9. Inside the center bag 8, a central pressure chamber (also referred to as simply a pressure chamber) 24 is formed by a resilient film 81 and a center bag holder 82. Inside the ring tube 9, an intermediate pressure chamber (also referred to as simply a pressure chamber) 25 is formed by a resilient film 91 and a ring tube holder 92.

Fluid paths 32, 33, 34, and 35, respectively, made up of tubing, connectors, etc., communicate with the pressures chamber 22 and 23, the central pressure chamber 24, and the intermediate pressure chamber 25. The pressure chambers 22, 23, 24, and 25 are connected to a compressed air supply (not illustrated), as a supply source, through regulators R2, R3, R4, and R5, respectively, which are placed in the fluid paths 32, 33, 34, and 35, respectively.

The system is configured so that a fluid such as air, either pressurized or at atmospheric pressure, can be supplied to the pressure chamber 21 above the chucking plate 6, as well as to the pressure chambers (22-25) through the fluid paths (31-35) in communication with their respective pressure chambers. The pressure of the pressurization fluid supplied to each of the pressure chambers (21-25) can be adjusted by the regulator (R1-R5) located in the fluid path (31-35) for that chamber. Thus the pressure in each of the chambers (21-25) can be controlled independently of the others, or can be placed at atmospheric pressure. Making the pressures in the different pressure chambers (21-25) independently adjustable by the regulators (R1-R5) enables the pressing force with which the substrate S is pressed against the polishing pad 15A to be adjusted separately for each part of the substrate S. Moreover, the pressure chambers 22 and 23 are configured to be switchably connected to a vacuum source (not shown in the drawing) so that the chambers 22 and 23 can be switched to a vacuum.

Because there is a slight gap H between the outer peripheral surface of the seal ring 42 and the retainer ring 3, the configuration at this point constitutes a floating structure in which some components (such as the holder ring 5, the chucking plate 6, and the seal ring 42 installed on the chucking plate 6) are movable vertically with respect to the substrate carrier main unit 2 and the retainer ring 3. Also, provided, at a number of locations on the stopper 5B of the holder ring 5, protruding outward from the periphery thereof, are a plurality of protrusions 5C. The vertical travel of the movable components (holder ring 5, etc.) is limited to a given point by the engagement of these protrusions 5C with the upper surface 3B of a portion 3A of the retainer ring 3 that protrudes inward from the retainer ring 3.

The regulators R1-R5, the fluid paths 31-35, the pressure chambers 21-25, and the chucking plate 6 are all part of the substrate-pressing mechanism 11.

Next, the mechanisms for rotating the substrate carrier 10 and moving it up and down will be described. The substrate carrier 10 is connected through a gimbal mechanism 52 to a load cell 51 installed at the lower end of the substrate carrier drive shaft 12.

The substrate carrier drive shaft 12 is positioned vertically in the apparatus, inserted in a spline bearing 53, which is in turn inserted in a pulley 54. The pulley 54 is rotatably installed in the inner cavity 56A of a support unit 56 in which it is housed. The vertically oriented substrate carrier drive shaft 12 passes through the horizontally oriented support unit 56. A drive means (not shown in the drawing) drives the substrate carrier drive shaft 12 through a timing belt 55 (indicated by phantom lines in the drawing) wrapped around the pulley 54. The timing belt 55 runs inside the inner cavity 56A.

Installed above the support unit 56 is a pulse motor 57 coupled to one end of a ball screw 58. The ball screw 58 is threaded into a ball nut 59 that is coupled to the top end of the substrate carrier drive shaft 12. Thus by operating the pulse motor 57, the substrate carrier 10 and its connected substrate carrier drive shaft 12 can be raised or lowered as a single unit, and stopped at the desired height. A stepping motor or servo motor can be used for the pulse motor 57.

Figure 2:
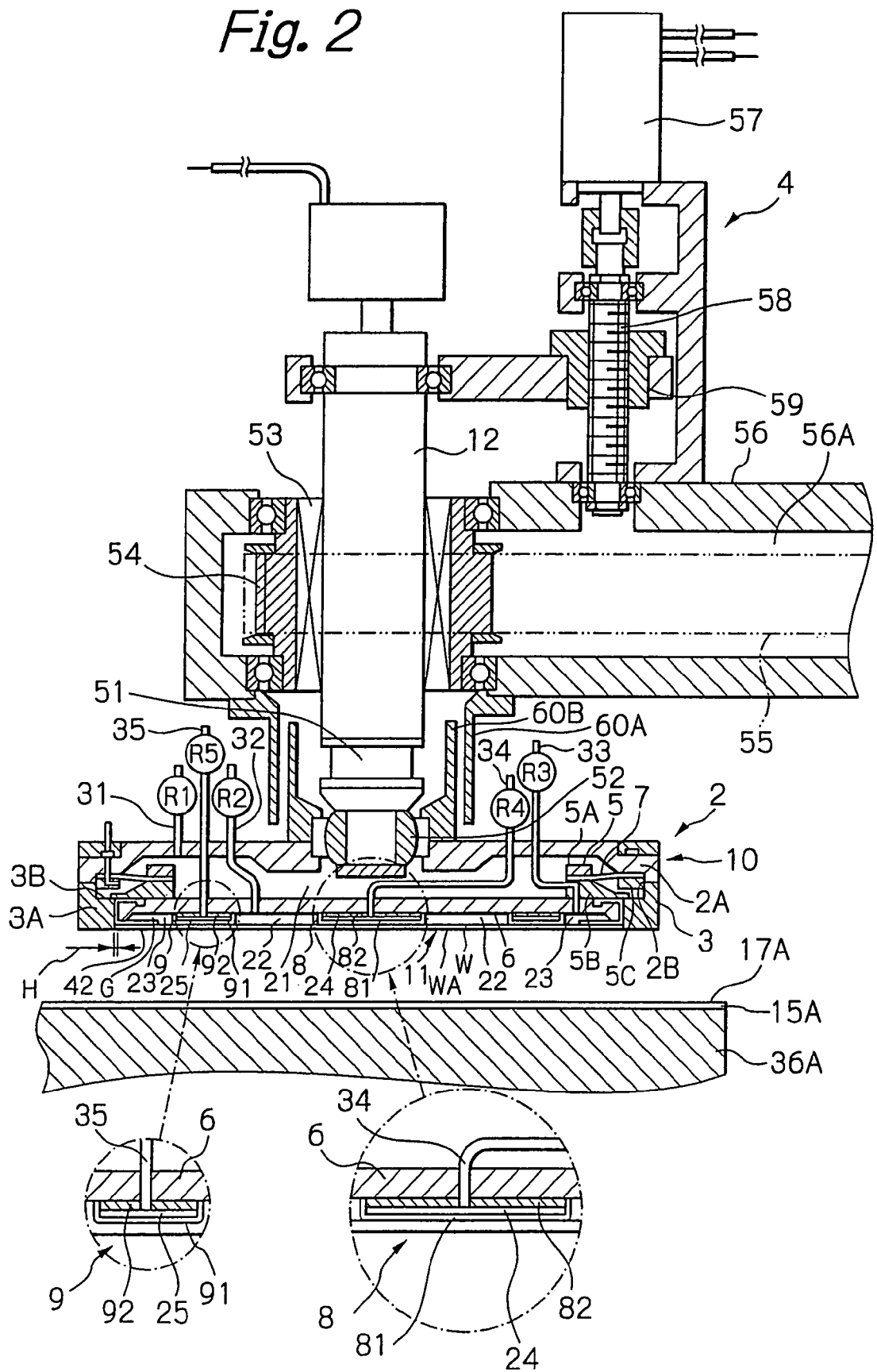
FIG. 2 is an enlarged partial cross-section view of the polishing apparatus of FIG. 1, with its substrate carrier positioned directly above its turntable.

Note that while not shown in FIG. 2 (see FIG. 1) the portion above and including the support unit 56 is housed within the carrier head 13. Also, a portion of the substrate carrier drive shaft 12 extending downward below the support unit 56, the load cell 51, and a portion of the gimbal mechanism 52, are enclosed within moisture barriers 60A and 60B. This is not shown in FIG. 1.

Provided as a sensor mechanism on the turntable 36A is a first end-point sensor mechanism 18, and provided as a sensor mechanism on the scroll table 36B is a second end-point sensor mechanism 19. The first and second end-point sensor mechanisms 18 and 19 detect the fact that the polishing of a substrate S has progressed to a prescribed value (end-point), at which point they output a detect signal to a control mechanism (not shown). The sensors used for the first and second end-point sensor mechanisms 18 and 19 may be either optical- or over-current-type sensors. If a polishing torque sensor for sensing polishing torque (not shown in the drawings) is provided in the polishing apparatus 1, for determining the amount of polishing based on the sensed polishing torque value, end-point sensor mechanisms need not be provided on the tables per-se.

The pulse motor 57, ball screw 58, ball nut 59, load cell 51 and substrate carrier drive shaft 12 are all included in the retainer-ring-position-adjustment mechanism 4. Also, the pulse motor 57, ball screw 58, ball nut 59, load cell 51, and substrate carrier drive shaft 12 are included in the retainer-ring-pressing mechanism 16 configuration.

Figure 3:
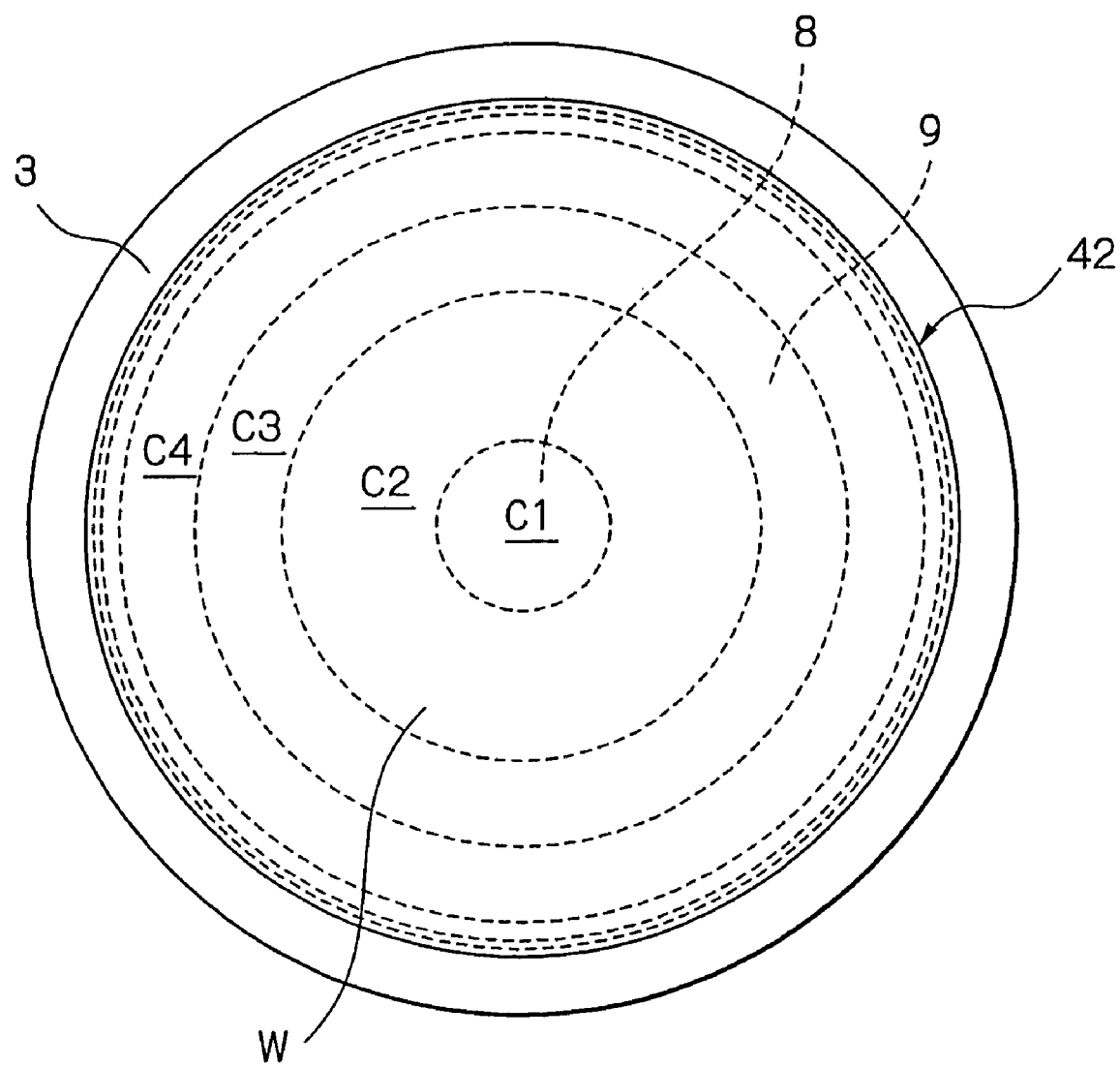
FIG. 3 is a plan view of a substrate that is retained in the substrate carrier of the polishing apparatus of FIG. 1.

The operation of the substrate carrier 10 of the polishing apparatus 1 in one embodiment of the present invention will now be described with reference to FIG. 2, and when appropriate, to FIGS. 1 and 3. In the polishing apparatus 1 of the present embodiment, to acquire and retain a substrate S in the substrate carrier 10, the entire substrate carrier 10 is first positioned directly over the substrate S. A pressurization fluid is then supplied to the center bag 8 and the pressure chambers 24 and 25 (inside the ring tube 9), to pressurize them to the prescribed pressure. Then, a pulse signal is transmitted from a control mechanism (not shown) to the pulse motor 57, to lower the substrate carrier 10. In response, the pulse motor 57 rotates the ball screw 58, driving it into the ball nut 59, causing the substrate carrier drive shaft 12 to descend, thus lowering the substrate carrier 10 until the bottom surfaces of the center bag 8 and ring tube 9 make a tight seal with substrate S to be held.

Next, the pressure chambers 22 and 23 are connected through the fluid paths 32 and 33, respectively, to a source of vacuum (not shown) to obtain negative pressures in the pressure chambers 22 and 23, thus to create the suction required to hold the substrate S by suction-adhesion. The control mechanism (not shown in the drawing) then transmits a pulse signal to the pulse motor 57 to raise the substrate carrier 10 with the substrate S held fast therein by suction. The pulse motor 57 operates (through the ball screw 58, ball nut 59, and substrate carrier drive shaft 12) similarly to the operation described above for lowering, but rotating in the opposite direction. Next, the pivotal shaft 14 is pivoted to shift the entire substrate carrier 10 as required to position it directly over the turntable 36A and its polishing pad 15A. Also, the periphery of the substrate S is held by the retainer ring 3 to prevent it from being dislodged from the substrate carrier 10 during polishing.

Next, the substrate carrier 10 is lowered to bring the surface of the substrate S to be polished, and the lower surface of the retainer ring 3, into contact with the polishing pad 15A. When the substrate S and the retainer ring 3 come into contact with the polishing surface 17A, this applies a load to the load cell 51 installed on the lower end of the substrate carrier drive shaft 12. The load cell 51 detects the load and sends a 'load detect' signal to the control mechanism (not shown), which then recognizes that the substrate S and retainer ring 3 have been brought into contact with the polishing pad 15A.

The control mechanism then sends pulse signals to the pulse motor 57 so that the pulse motor rotates to raise the substrate carrier 10 to the prescribed position. This makes it possible to keep the positions of the polishing pad 15A and retainer ring 3 the same, regardless of retainer ring 3 wear. Specifically the substrate carrier 10 is raised approximately 0.2 mm, but because the substrate S is approximately 0.8 mm thick, it cannot be thrown from the bottom of the substrate carrier 10 during polishing.

With the apparatus in this state, pressurization fluid is supplied to the pressure chambers 21-23 at a prescribed pressure, to press the substrate S against the polishing surface 17A on the turntable 36A. Polishing solution is caused to flow from a polishing solution supply nozzle (not shown) so as to maintain a sufficient quantity of polishing solution on the polishing pad 15A to ensure that polishing is always performed with polishing solution present between the to-be-polished substrate surface SA and the polishing surface 17A of the polishing pad 15A.

At this stage (see FIG. 3), the portions C2 and C4 of the substrate S (the portions positioned under the pressure chambers 22 and 23) are pressed against the polishing surface 17A by fluid pressures supplied to the pressure chambers 22 and 23, respectively. Similarly, the portion C1 of the substrate S, which is positioned under the central pressure chamber 24, is pressed against the polishing pad 15A by pressurization fluid pressure, which is applied to the central pressure chamber 24 via the resilient film 81 of the center bag 8. The portion C3 of the substrate S, which is positioned under the intermediate pressure chamber 25, is pressed against the polishing surface 17A by pressurization fluid pressure applied, through the resilient film 91 of the ring tube 9, to the intermediate pressure chamber 25. Further, the force with which the substrate S is pressed against the polishing surface 17A can be changed by supplying pressurization fluid to the pressure chamber 21, or changing the pressure of the pressurization fluid.

Thus the polishing pressures applied to the substrate S can be adjusted by controlling the pressure of the pressurization fluid supplied to each of the pressure chambers 21-25. That is, the force with which the substrate S is pressed against the polishing pad 15A on the turntable 36A can be adjusted independently for each of the individual portions C1-C4 of the substrate S. This is done by individually adjusting the regulators R1-R5 placed in the fluid paths 31-35, respectively, to thereby adjust the pressures of the pressurization fluid supplied to the individual pressure chambers 21-25.

In this manner, the substrate S can be pressed against the polishing pad 15A of the rotating turntable 36A with the polishing pressure applied to each of the portions C1-C4 of the substrate S individually adjusted to a desired value. By appropriately adjusting the pressing force used to press the substrate S against the polishing pad 15A, the distribution of polishing pressure over the portions of the substrate S surface (the portion C1, positioned under the central pressure chamber 24; the portion C2, positioned under the pressure chamber 22; the portion C3, positioned under the intermediate pressure chamber 25; and the portion C4, the pressure chamber 22 portion) can be adjusted as desired.

Thus the substrate S can be divided into four concentric circles (the circular portion C1 and the ring-shaped portions C2-C4) and each of these separate portions C1-C4 can be pressed with an independently defined pressing force. The polishing rate is dependent on the pressure with which the substrate S is pressed against the polishing pad 15A, and because the pressure applied to each of the substrate S portions C1-C4 can be adjusted as described above, the polishing rate can also be independently controlled for the different sections of the four sections C1-C4. This makes it possible to obtain uniform polishing over the entire surface of the substrate S with no under-polishing or over-polishing, even when a thin film on a substrate S surface to be polished has a radial film thickness distribution.

The substrate S can also be polished with the retainer ring 3 not in contact with the polishing surface 17A. This allows more polishing solution to enter between the to-be-polished substrate surface SA of the substrate S and the polishing surface 17A than would be possible with the retainer ring 3 in contact with the polishing surface 17A, thereby increasing the polishing rate. In addition to increasing the polishing rate, the polishing with the retainer ring 3 not in contact with the polishing surface also reduces retainer ring 3 wear, which dramatically extends retainer ring 3 service life.

To perform polishing with the retainer ring 3 in contact with the polishing pad 15A, after the substrate carrier 10 has been lowered sufficiently to bring the substrate S and retainer ring 3 into contact with the polishing pad 15A, the following operation is performed: Pulse signals are sent from the controller (not shown) to the pulse motor 57, to cause the pulse motor 57 to rotate the ball screw 58, which operates in cooperation with the ball nut 59 and substrate carrier drive shaft 12 to further lower the substrate carrier 10 and thus press the retainer ring 3 with an increasing force against the polishing pad 15A until the load cell 51 detects a load that corresponds to the retainer ring pressure specified in a pre-set polishing recipe.

Polishing pressure is controlled using feedback control. Thus, when the retainer ring 3 is pressed against the polishing pad 15A, this applies a load to the load cell 51, and when the load reaches a prescribed value a load signal is transmitted by the load cell 51 to the control mechanism to stop rotation of the pulse motor 57. Then, as described above, the substrate S is pressed against the polishing pad 15A by pressurizing the pressure chambers 21-23; and if required, changing the pressures in the central and intermediate pressure chambers 24 and 25; and the turntable 36A is rotated, to perform the polishing operation.

When this is done, polishing pad 'edge rounding' problems that occur when polishing cloths such as ICI 1000/SUBA400 are used as the polishing pad 15A, can be solved by controlling retainer ring pressure. This also improves uniformity within the substrate S surface, and increases productivity.

Next, referring to the drawings, operation of the polishing apparatus 1 of the present embodiment will be described for a polishing process in which the retainer ring 3 is brought into contact with the polishing surface 17, and a process in which it is not. For this operation, the polishing tools 15 used on the turntable 36A and scroll table 36B are as described below.

A Polishing Procedure (1) will be described with reference to FIG. 2, and when applicable, to FIGS. 5 and 4A. In this procedure, a metal film 61 is polished first; then a rest of the metal film 61 and a metal film 62 are polished at the same time.

Figure 5:
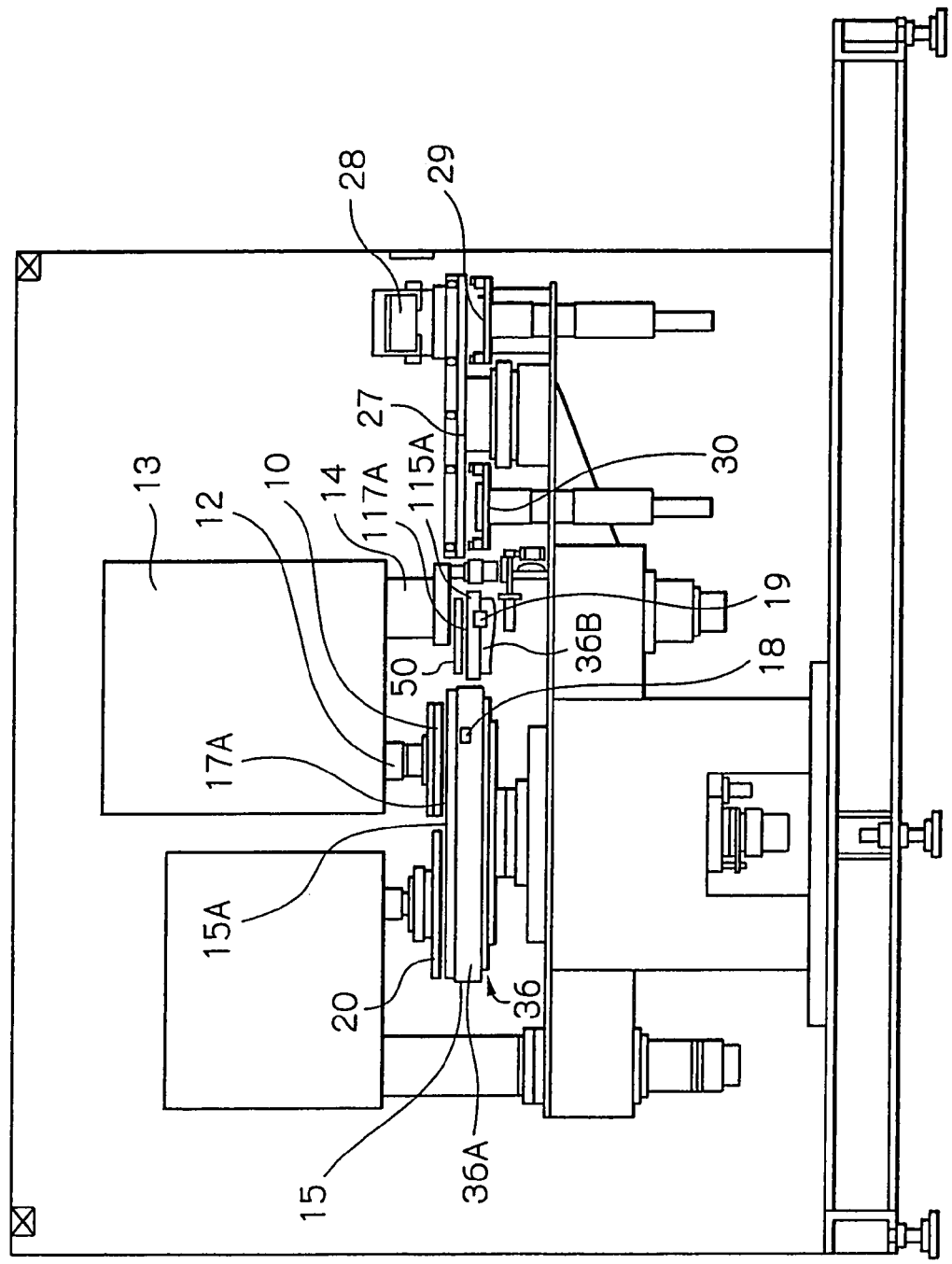
FIG. 5 shows an external view of the polishing apparatus in another embodiment of the present invention.

Here, as shown in FIG. 5, a polishing pad 15A is used on the turntable 36A, the same as in FIG. 1; but on the scroll table 36B, a polishing pad 115A (instead of a fixed abrasive 15B) is used as the polishing tool. The polishing pad 115A has a polishing surface 117A.

Figure 4A:
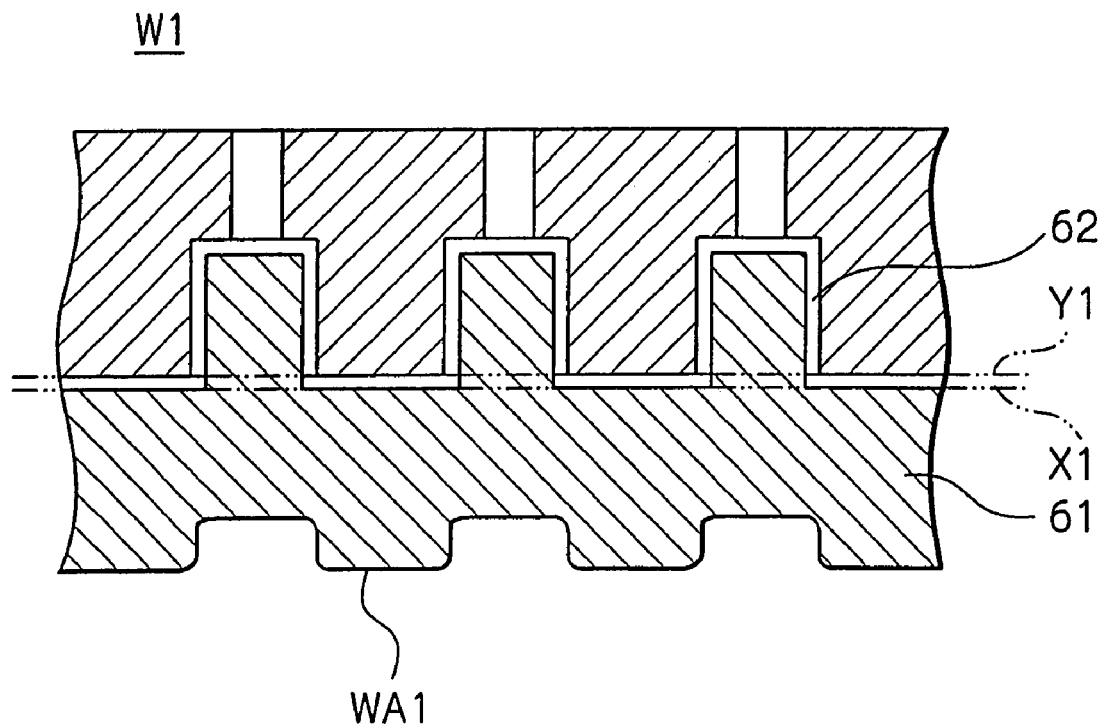
FIG. 4(A) shows a typical cross-section of substrate having portions to be polished that include a film of one metal, and a film of another metal sandwiched between films of the first metal.

A substrate S1, a cross-section of which is shown in FIG. 4(A), has a metal film 61, (of copper, etc.) formed by a process such as electroplating, and a metal film 62 formed as a barrier layer under the metal film 61. Polishing of metal film 61 only is performed up to a level designated as X1 in the drawing;

then, from the X1 level to a Y1 level, simultaneous polishing of the metal film 61 and the metal film 62 is performed.

First, the substrate carrier head 13 is pivoted about the pivotal shaft 14 to position the substrate carrier 10 directly over the pusher 30. Next, the pressure chambers 24 and 25 are pressurized, and the pusher 30 is raised until the substrate S1 to be polished is touching the bottom of the substrate carrier 10 (the seal ring 42 and the resilient films 81 and 82). Then, a negative pressure is obtained in the pressure chambers 22 and 23 to create suction to hold the substrate S1 against the substrate carrier 10. At this point, the substrate S1 being held on the substrate carrier 10 is surrounded by the retainer ring 3.

Next, the substrate carrier 10 is positioned directly above the turntable 36A, after which the pulse motor 57 shaft is rotated to lower the substrate carrier 10 so as to bring the retainer ring 3 into contact with the polishing pad 15A on the turntable 36A and press the substrate S1 against the polishing pad 15A. After the substrate carrier 10 touches the polishing pad 15A, however, the pulse motor 57 is reversed to raise the substrate carrier 10 slightly (e.g. 0.2 mm), thus positioning the retainer ring 3 above the polishing pad 15A, to form a gap of the prescribed size between the bottom of the retainer ring 3 and the polishing surface 17A of the polishing pad 15A.

Now, the pressure chambers 21-23 are pressurized, pressing the substrate S1 against the polishing pad 15A; and the turntable 36A is turned, effecting relative motion between the substrate S1 and the polishing surface 17A; to polish the metal film 61. This technique (i.e., polishing with the retainer ring 3 not touching the polishing surface 17A) improves the entry of polishing solution between the to-be-polished substrate surface SA1 of the substrate S1 and the polishing surface 17A, which increases the polishing rate. Because the technique also reduces retainer ring 3 wear, it greatly extends the service life of the retainer ring 3.

When the prescribed amount of polishing has been performed, and the first end-point sensor mechanism 18 detects that the to-be-polished substrate surface SA1 has reached the X1 level, the rotation of the turntable 36A is stopped. The pressure chamber 21 is now taken to atmospheric pressure, and the pressure chambers 22 and 23 are taken to negative pressure, thus creating suction to cause the substrate S1 to adhere to the substrate carrier 10. The pulse motor 57 is now operated to raise the substrate carrier 10, completing the polishing process on the turntable 36A.

Next, the substrate carrier head 13 is pivoted about the pivotal shaft 14 to position the substrate carrier 10 directly over the scroll table 36B. The substrate carrier 10 is now lowered, the pressure chambers 21-23 pressurized, and the to-be-polished substrate surface SA1 pressed against the polishing pad 115A, to begin polishing. After the substrate carrier 10 makes contact with the polishing pad 115A, without raising the substrate carrier 10, the pulse motor 57 is rotated slowly and the substrate carrier 10 lowered slightly, pressing the retainer ring 3 against the polishing pad 115A, to polish the metal film 61 and metal film 62. When polishing is performed in this manner, the polishing pad 115A experiences no "edge rounding" problem. This enables uniform polishing up to the edge of the to-be-polished substrate surface SA1, thus enabling an increase in planarity.

When the prescribed amount of polishing has been performed: i.e., when the to-be-polished substrate surface SA1 has reached the Y1 level; this is detected by the second end-point sensor mechanism 19, and the polishing is stopped.

The pressure chamber 21 is then taken to atmospheric pressure, and the pressure chambers 22 and 23 to negative pressure, thus creating suction to hold the substrate S1 on the substrate carrier 10. The substrate carrier 10 is then raised, ending the polishing process on the scroll table 36B. Next, the substrate carrier 10 is positioned directly over the pusher 30, and the pusher 30 is raised to the substrate transfer position.

The pressure chambers 22 and 23 are then returned to atmospheric pressure to release the substrate S1 from the substrate carrier 10 and transfer it to the pusher 30.

Figure 4B:
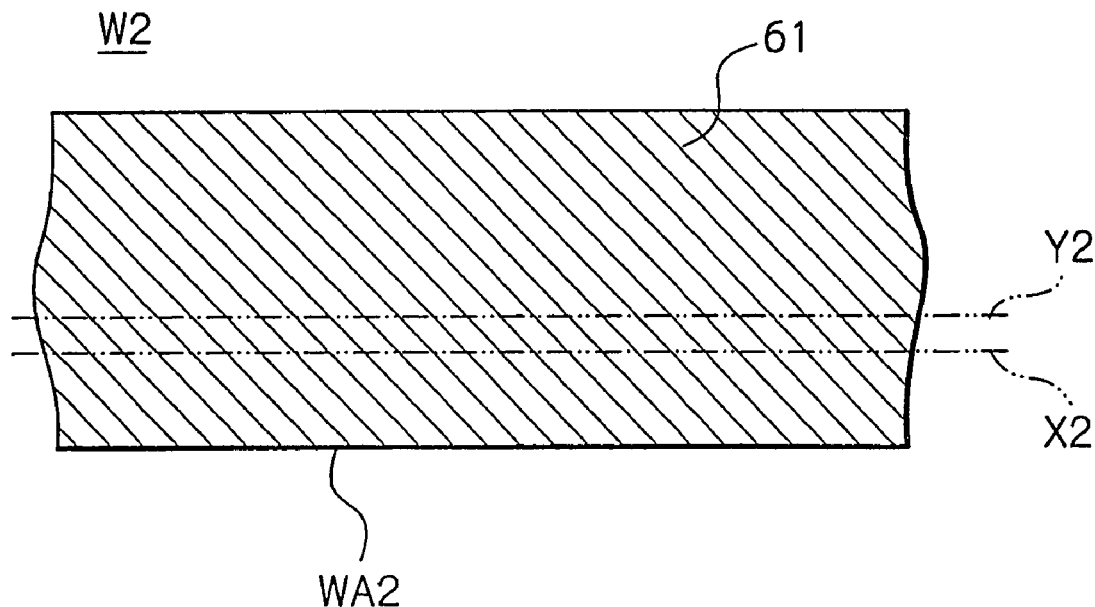
FIG. 4(B) shows a typical cross-section of a substrate made up of one metal film, where that one film is to be polished.

The above description of Polishing Procedure (1) described polishing a substrate S1 in which the portion to be polished comprised a metal film 61 and a metal film 62. However, the polishing of a substrate S2 in which the portion to be polished has only a metal film 61, as shown in FIG. 4B, may also be performed by first polishing as far as the X2 level, and then polishing to the Y2 level, following the same Polishing Procedure (1) for both portions. In such cases, the polishing rate for the portion prior to the X2 level can be increased, to improve productivity; and polishing between the X2 and Y2 levels can be performed to obtain the best possible surface planarity.

A Polishing Procedure (2) as used to polishing a metal film 61 using a single polishing table 36, will now be described with reference to FIG. 2, and when applicable, to FIG. 4(B). This example uses the turntable 36A shown in FIG. 2, with a polishing pad 15A used on the turntable 36A (FIG. 2). A substrate S2 as shown in FIG. 4(B) is used as the substrate to be polished.

The following description describes only the portions of this procedure that are different from Polishing Procedure (1): Up to the level X2, polishing of the substrate S2 is performed with a gap under the retainer ring 3, at which point the substrate carrier 10 is raised. The substrate carrier 10 is then again lowered (without moving it over the scroll table 36B), and polishing from X2 to Y2 is performed with the retainer ring 3 pressed against the polishing surface 117A. The results obtained in the two procedures are essentially the same, but the process time using Polishing Procedure (2) is shorter by as much time as it would take to move the substrate carrier 10 to the scroll table 36B.

A Polishing Procedure (3) will now be explained with reference to FIG. 6, and when applicable, to FIG. 4. The procedure will be described for an example in which polishing performed using a fixed abrasive 15B is followed by polishing performed with a polishing pad 15A. Polishing Procedure (3) is fundamentally the same as Polishing Procedure (1).

Figure 6:
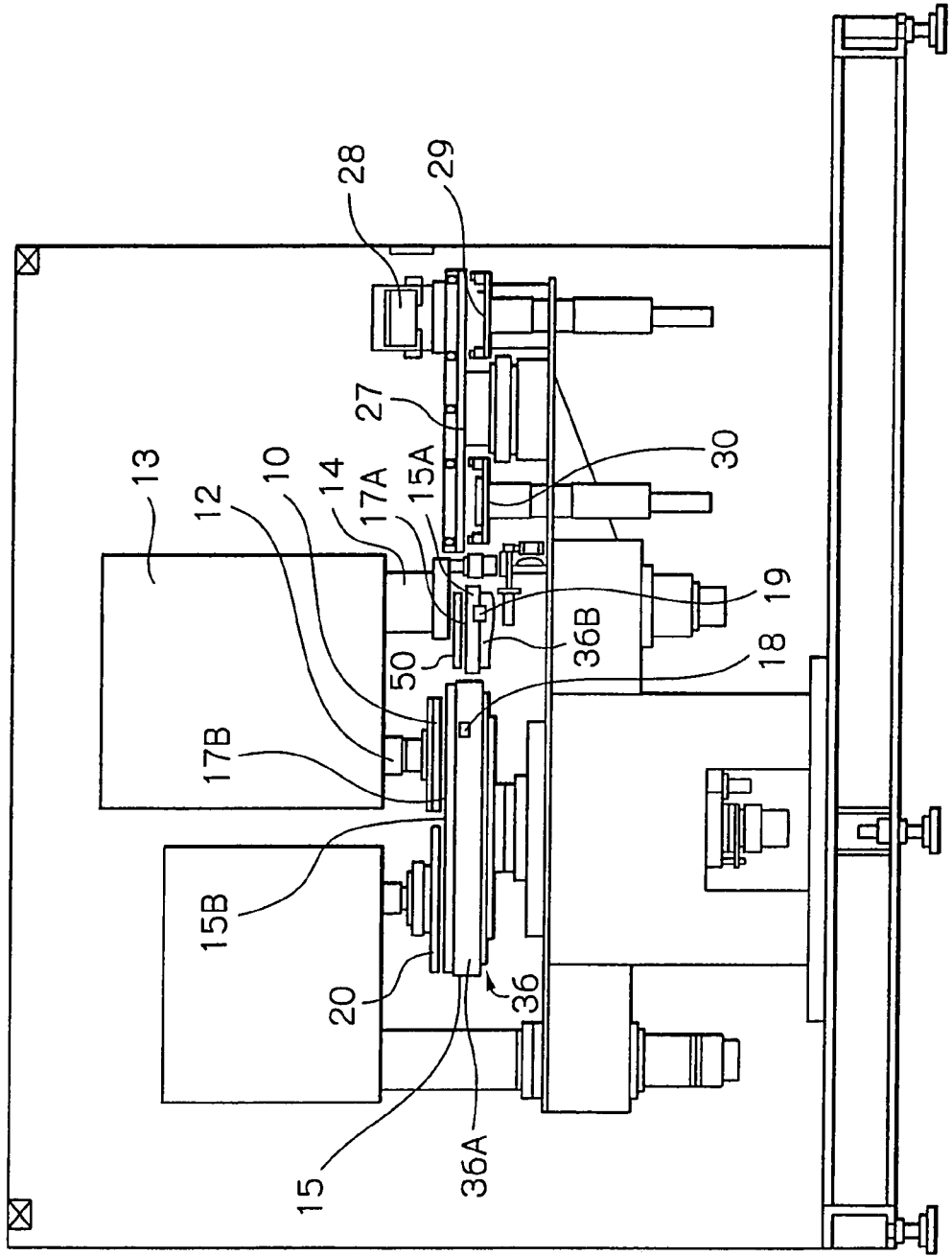
FIG. 6 shows an external view of the polishing apparatus in yet another embodiment of the present invention.

Unlike the apparatus of FIG. 1, the apparatus of FIG. 6 uses a fixed abrasive 15B on the turntable 36A, and a polishing pad 15A on the scroll table 36B. The workpiece may be either a substrate S1 as shown in FIG. 4(A), or a substrate S2 as shown in FIG. 4(B).

The following description would also apply for a substrate S2. That is, in the following text, 'S2' could be substituted for all instances of 'S1.' The substrate S1 is secured on the substrate carrier 10 by suction. The substrate carrier 10 is then moved over the turntable 36A and lowered until the retainer ring 3 (FIG. 2) touches the fixed abrasive 15B. After the retainer ring 3 makes contact with the fixed abrasive 15B, the substrate carrier 10 is raised slightly to form a gap of prescribed size between the retainer ring 3 and the polishing surface 17B of the fixed abrasive 15B. Next, polishing is performed, with the substrate S1 pressed against the fixed abrasive 15B. Since the initial pressing of the retainer ring 3 against a fixed abrasive 15B does not cause the "edge rounding" problem, it is not necessary, in this case, to keep the retainer ring 3 pressed against the polishing surface 17B to suppress rebound.

Because a gap of the prescribed size is formed between the retainer ring 3 and the polishing surface 17B of the fixed abrasive 15B, the entry of polishing solution between the to-be-polished substrate surface SA1 of the substrate S1 and the polishing surface 17A of the fixed abrasive 15B is improved, which increases the polishing rate. Because this also reduces retainer ring 3 wear, it greatly extends the service life of the retainer ring 3.

When the prescribed amount of polishing has been performed; i.e., when the to-be-polished substrate surface SA1 of the substrate S1 has reached the X1 level (X2 if it is a substrate S2), this is detected by the first end-point sensor mechanism 18, after which the substrate carrier 10 is raised, ending the polishing operation on turntable 36A.

Next, with the substrate S1 secured to the substrate carrier 10 by suction, the substrate carrier 10 is moved to a position directly above the scroll table 36B, and then lowered until the retainer ring 3 comes into contact with the polishing pad 15A. Then the substrate carrier 10 is lowered slightly, pressing the retainer ring 3 against the polishing pad 15A. Polishing is then performed with the substrate S1 pressed against the polishing pad 15A. This makes it possible to perform uniform polishing to the edge of the substrate S1.

When the prescribed amount of polishing has been performed, as sensed by the second end-point sensor mechanism 19; i.e., when the to-be-polished substrate surface SA1 has been polished down to the Y1 level (or Y2 level in the case of a substrate S2) the substrate carrier 10 is raised, ending the polishing operation on the scroll table 36B. The substrate carrier 10 is then moved over the pusher 30, to transfer the polished substrate S1 to the pusher 30.

Moreover, in Polishing Procedure (3), instead of performing the step of polishing with a fixed abrasive 15B first, followed by the step of polishing with a polishing pad 15A, the order of these steps may be reversed. Even when the order is reversed, however, polishing with a polishing pad 15A should still be performed with the retainer ring 3 pressed against the polishing pad 15A, and polishing with a fixed abrasive 15B should still be performed with a prescribed gap formed between the retainer ring 3 and the fixed abrasive 15B.

In the above examples, a single substrate carrier was used to perform consecutive polishing processes using two different polishing tools 15. It should be obvious, however, that the present invention would also be useful for polishing performed using three or more polishing tools 15. Moreover, the specific examples described above described only the polishing of metal films, but it should also be obvious that the present invention would also be useful for the polishing of other films such as insulator films, or of STI (shallow trench isolation) process. Also, the polishing apparatus 1 of the present invention is capable of supporting operations that require only one polishing tool 15, as well as those requiring multiple polishing tools 15. It is also capable of supporting operations in which pressing force must be applied to the retainer ring 3, as well as those in which a gap must be provided between the retainer ring 3 and the polishing surface 17, with no requirement to apply pressing force to the retainer ring 3. The present invention therefore provides a polishing apparatus 1 and method for polishing that provide high substrate planarity, high polishing rates, and high productivity, for support of a broad range of polishing applications.

Figure 7:
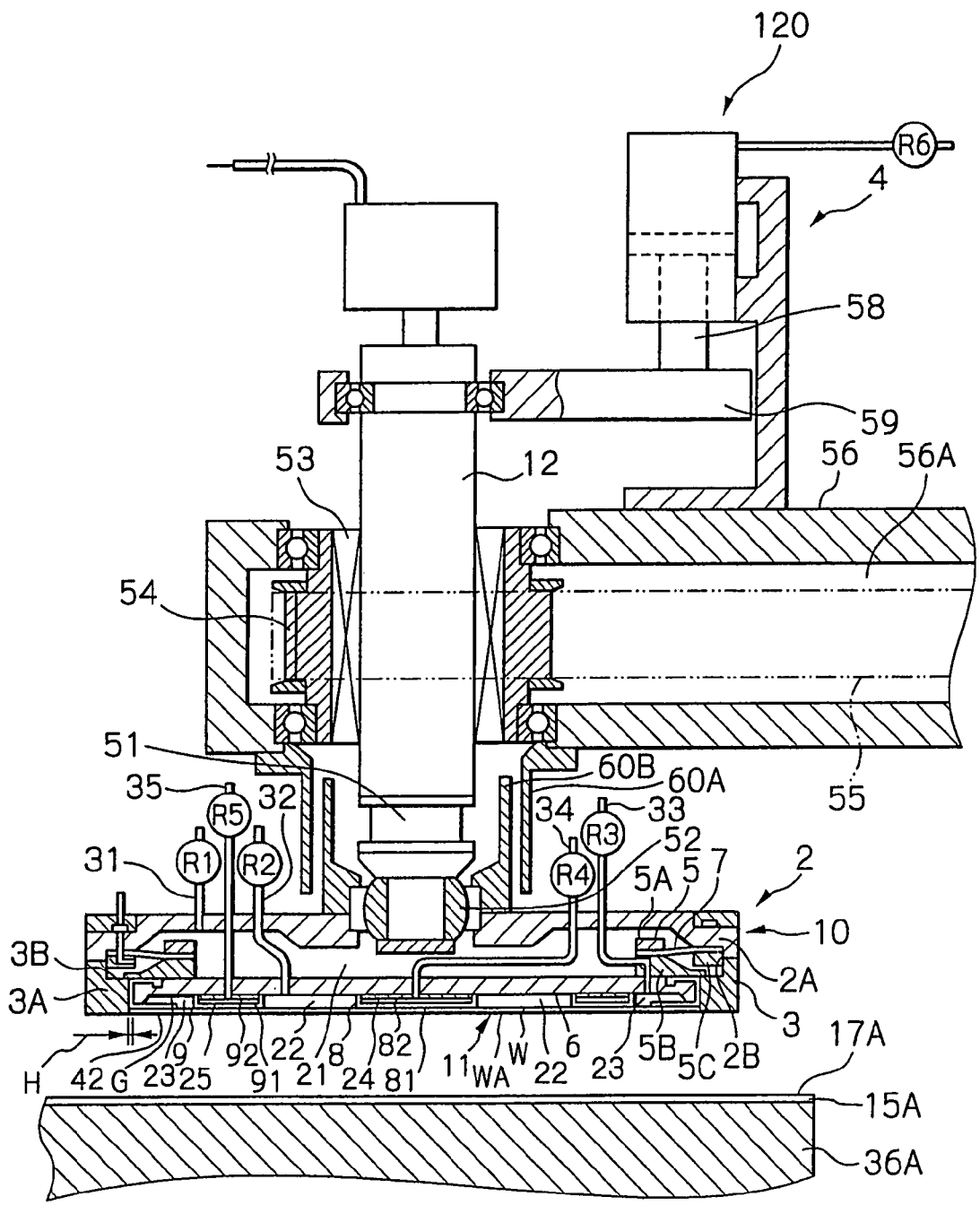
FIG. 7 is an enlarged partial cross-section view of the polishing apparatus in a further embodiment of the present invention.

FIG. 7 illustrates a polishing apparatus in accordance with a further embodiment of the present invention. The polishing apparatus of this embodiment is different from those of the afore-mentioned embodiments with respect to their retainer-ring-position-adjustment mechanism 4. That is, in the former apparatus, the retainer-ring-position-adjustment mechanism 4 is not provided and an air cylinder 120 is used as its actuator or a retainer-ring-pressing mechanism instead of the pulse motor 57 used in the latter apparatuses.

The retainer-ring-position-adjustment mechanism of this embodiment is not able to position the retainer ring relative to the polishing surface as precisely as that of the embodiment described above. In actuality, the mechanism of this embodiment effects adjustment by applying an upward acting force on the retainer ring while keeping it in contact with the polishing surface. The force applied is only sufficient to maintain contact between the retainer ring and the polishing surface, to thereby enable a polishing solution to easily pass between the retainer ring and the polishing surface and enter between the substrate surface and the polishing surface, so as to provide an increased polishing rate. Needless to say, it is also possible in this embodiment for the retainer-ring-position-adjustment mechanism to space the retainer ring apart from the polishing surface, as is done in the embodiment described above.

In the present invention, as described above, a retainer-ring-pressing mechanism is provided for pressing the retainer ring against a polishing surface. This eliminates the problem of 'edge rounding' in the polished surface, thus improving the substrate finish precision. Also provided is a retainer-ring-position-adjustment mechanism. When the substrate is pressed against the polishing surface, this mechanism makes it possible to adjust the positional relationship between the retainer ring and polishing surface such as to form a gap therebetween, or to make the retainer ring in slight contact with the polishing surface. This lack of physical contact or a slight contact between the retainer ring and the polishing surface increases the polishing rate (speed) thus improving polishing productivity.

The invention claimed is:

1. A method for polishing a substrate comprising:
   holding the substrate by a substrate carrier;
   bringing the substrate carrier into contact with a polishing surface by lowering the substrate carrier;
   raising the substrate carrier so as to be separated from the polishing surface by a vertical distance, and fixing the substrate carrier at a predetermined raised position;
   supplying a pressurized fluid above the substrate to press the substrate against the polishing surface; and
   subjecting the substrate and the polishing surface to relative sliding motion in order to polish the substrate.

2. A method according to claim 1, wherein the pressurized fluid is supplied inside of inflatable chambers defined by a resilient member for applying fluid pressure to the substrate.

3. A method according to claim 1, wherein the substrate carrier comprises a retainer ring for surrounding the substrate, and the contact of the substrate carrier with the polishing surface is detected by judging whether the retainer ring contacts with the polishing surface.

4. A method according to claim 1, wherein the contact of the substrate carrier with the polishing surface is detected by judging whether the substrate contacts with the polishing surface.

5. A method according to claim 1, wherein the contact of the substrate carrier with the polishing surface is detected by a load cell installed at a lower end of a substrate carrier drive shaft.

6. A method according to claim 1, wherein an end point of polishing of the substrate is determined based on an output signal from an optical sensor, an over-current-type sensor or a polishing torque sensor.

7. A method according to claim 2, wherein a pressure in the inflatable chambers is kept to negative pressure during said holding of the substrate and before said supplying of the pressurized fluid.

* * * * *